United States Patent [19]

Hart

[11] Patent Number: 5,035,945

[45] Date of Patent: Jul. 30, 1991

[54] POLYMERIC FILMS

[75] Inventor: Charles R. Hart, Yarm, Cleveland, England

[73] Assignee: Imperial Chemical Industries plc, London, England

[21] Appl. No.: 382,289

[22] Filed: Jul. 20, 1989

[30] Foreign Application Priority Data

Jul. 25, 1988 [GB] United Kingdom ............. 8817663

[51] Int. Cl.$^5$ .................. B32B 5/16; B32B 15/08
[52] U.S. Cl. ................... 428/323; 428/458; 428/461
[58] Field of Search ............ 428/458, 461, 323

[56] References Cited

U.S. PATENT DOCUMENTS 4,542,074  9/1985  Sirinyan et al. .......... 428/457 X
4,704,325 11/1987  Crocker ................. 428/354
4,812,355  3/1989  Yokoyama et al. ......... 428/461 X
4,908,276  3/1990  Yamamoto ............... 428/458

Primary Examiner—Thomas J. Herbert, Jr.
Attorney, Agent, or Firm—Cushman, Darby & Cushman

[57] ABSTRACT

A metallized film has a substrate layer of a synthetic polymeric material, and on at least one surface thereof an adherent layer of an acrylic or methacrylic copolymer, the copolymer comprising (a) a comonomer selected from acrylic acid, methacrylic acid or a derivative of acrylic acid or methacrylic acid,
(b) a copolymerizable sulphonated ethylenically unsaturated comonomer, and optionally
(c) an additional comonomer, said comonomers (a) and (b) being present in the respective molar percentages in the ranges (a) 26 to 99% and (b) 1 to 50%.

A metallic layer is on the surface of the at least one adherent layer, remote from the substrate.

8 Claims, 1 Drawing Sheet

POLYMERIC FILMS

This invention relates to a metallised film and, in particular, to a metallised film comprising a primed polymeric substrate.

Metallic foils, such as aluminum foil, which hitherto have been employed as packaging materials for snack foods, bakery products, potato crisps, coffee beans etc, are increasingly being replaced by less costly metallised film composite structures comprising a substrate of a polymeric film coated with a thin metallic layer. The polymeric film substrate generally provides a strong, flexible packaging medium offering desirable oxygen and moisture barrier properties, and these characteristics are supplemented by the presence of the metallic layer which additionally provides barrier to visible and ultra-violet light thereby delaying the onset of oxidative degradation to which certain packaged products are vulnerable.

To promote adhesion between a polymeric film and a subsequently deposited metallic layer it is advantageous to employ an intermediate priming layer. Even so, available metallised films are prone to rupture by failure of the adhesive bond between the substrate and metallic layer, particularly if a film package is exposed to impacts, or otherwise mishandled—for example, by being accidentally dropped onto a relatively solid surface.

We have now devised a metallised film exhibiting improved adhesion between the substrate and metallic layer.

Accordingly, the present invention provides a metallised film comprising a substrate layer of a synthetic polymeric material having on at least one surface thereof an adherent layer and a metallic layer on the surface of the at least one adherent layer remote from the substrate, wherein the adherent layer comprises an acrylic or methacrylic copolymer, the copolymer comprising
(a) a comonomer selected from acrylic acid, methacrylic acid or a derivative of acrylic acid or methacrylic acid,
(b) a copolymerisable sulphonated ethylenically unsaturated comonomer, and optionally
(c) an additional comonomer, said comonomers (a) and (b) being present in the respective molar percentages in the ranges (a) 26 to 99% and (b) 1 to 50%.

The invention also provides a method of producing a metallised film by forming a substrate layer of a synthetic polymeric material, applying to at least one surface thereof an adherent layer, and depositing a metallic layer on the surface of the at least one adherent layer remote from the substrate, wherein the adherent layer comprises an acrylic or methacrylic copolymer, the copolymer comprising
(a) a comonomer selected from acrylic acid, methacrylic acid or a derivative of acrylic acid or methacrylic acid,
(b) a copolymerisable sulphonated ethylenically unsaturated comonomer, and optionally
(c) an additional comonomer, said comonomers (a) and (b) being present in the respective molar percentages in the ranges (a) 26 to 99% and (b) 1 to 50%.

It has been discovered that comonomer (b) promotes metal adhesion and also confers anti-static properties upon the coated film base. The adherent copolymer may be derived from one or more comonomers falling within the definitions of each of the comonomers (a) and (b).

Comonomer (a) for the adherent copolymer is preferably present in an amount of from 50 to 90 mole % and preferably comprises an ester of acrylic acid or methacrylic acid, especially an alkyl ester where the alkyl group contains up to ten carbon atoms such as methyl, ethyl, n-propyl, isopropyl, n-butyl, isobutyl, terbutyl, hexyl, 2-ethyl, hexyl, heptyl, and n-octyl. Copolymers derived from an alkyl acrylate, especially ethyl acrylate, together with an alkyl methacrylate provide particularly effective adhesion between the thermoplastics polymeric film substrate and metallised layer. Adherent copolymers comprising an alkyl acrylate, e.g. ethyl acrylate or butyl acrylate, together with an alkyl methacrylate, e.g. methyl methacrylate, desirably in a total molar proportion in the range 55 to 80 mole %, are particularly preferred. The acrylate comonomer of such copolymers is preferably present in a proportion in the range 15 to 45 mole %, and the methacrylate comonomer is preferably present in a proportion in the range 30–50 mole %. The amount of methacrylate comonomer present preferably exceeds the amount of acrylate comonomer generally by the amount in the range 5 to 20 mole %.

Other comonomers falling within the definition of comonomer (a) which are suitable for use in the preparation of the adherent copolymer which may be used instead of, but are preferably copolymerised as optional additional comonomers together with acrylic acid or methacrylic acid or esters of the acids include acrylonitrile, methacrylonitrile, halo-substituted acrylonitrile, halo-substituted methacrylonitrile, acrylamide, methacrylamide, N-methylol acrylamide, N-ethanol acrylamide, N-propanol acrylamide, N-methylol methacrylamide, N-ethanol methacrylamide, N-methyl acrylamide, N-tertiary butyl acrylamide, hydroxyethyl methacrylate, glycidyl acrylate, glycidyl methacrylate, dimethylamino ethyl methacrylate, itaconic acid, itaconic anhydride and half esters of itaconic acid.

Comonomer (b) which provides anti-static protection for the adherent layer and has also been found to be effective in promoting the adhesion of the metallised layer preferably comprises a salt and most preferably an alkali metal salt, e.g. a sodium salt. Vinyl sulphonic acid and its salts are especially effective adhesion-promoting comonomers.

Comonomers which function to modify the properties of the adherent layer may optionally, be included in the production of the adherent copolymer.

The adhesion of the adherent layer to the thermoplastics polymeric film substrate may be modified by including one or more comonomers having cross-linkable functional groups in the comonomeric recipe for the formation of the adherent copolymer. Epoxy group-containing comonomers, such as glycidyl acrylate and glycidyl methacrylate, are effective in providing internal cross-linking within the adherent layer and possibly polymer film substrate. A comonomeric amount of 5 to 25 mole %, preferably 15 to 25 mole %, of glycidyl acrylate or glycidyl methacrylate is effective in providing the desired adhesion properties.

Other optional comonomers include vinyl esters such as vinyl acetate, vinyl chloroacetate and vinyl benzoate; vinyl pyridine; vinyl chloride; vinylidene chloride; maleic acid; maleic anhydride; butadiene; styrene and derivatives of styrene such as chloro styrene, hydroxy styrene and alkylated styrenes.

Particularly preferred adherent copolymers for use according to the invention include copolymers comprising 15 to 45 mole % of an alkyl acrylate, e.g. ethyl acrylate, 30 to 50 mole % of an alkyl methacrylate, e.g. methyl methacrylate, 1 to 20 mole % of a sulphonated comonomer, e.g. sodium vinyl sulphonate and 7 to 20 mole % of itaconic acid optionally with other comonomers such as glycidyl acrylate or methacrylate in a proportion generally in the range 10 to 20 mole %. An especially effective adherent copolymer is 48/37/10/5 mole % ethyl acrylate/methyl methacrylate/itaconic acid/sodium vinyl sulphonate.

Conventional additives may be included in the adherent layer e.g. adhesion promoters and particulate fillers for providing slip properties.

If desired, the adherent composition may also contain a cross-linking agent which functions to cross-link the adherent copolymer thereby improving adhesion to the polymeric film substrate. Additionally, the cross-linking agent should preferably be capable of internal cross-linking in order to provide protection against solvent penetration. Suitable cross-linking agents may comprise epoxy resins, alkyd resins, amine derivatives such as hexamethoxymethyl melamine, and/or condensation products of an amine, e.g. melamine, diazine, urea, cyclic ethylene urea, cyclic propylene urea, thiourea, cyclic ethylene thiourea, alkyl melamines, aryl melamines, benzo guanamines, guanamines, alkyl guanamines and aryl guanamines, with an aldehyde, e.g. formaldehyde. A useful condensation product is that of melamine with formaldehyde. The condensation product may optionally be alkoxylated.

The cross-linking agent may be used in amounts of up to 25% by weight based on the weight of the copolymer in the adherent composition. A catalyst is also preferably employed to facilitate cross-linking action of the cross-linking agent. Preferred catalysts for cross-linking melamine formaldehyde include ammonium chloride, ammonium nitrate, ammonium thiocyanate, ammonium dihydrogen phosphate, ammonium sulphate, diammonium hydrogen phosphate, para toluene sulphonic acid, maleic acid stabilised by reaction with a base, and morpholinium para toluene sulphonate.

The copolymers of the adherent composition are generally water-insoluble. The adherent compositions including the water-insoluble copolymers may nevertheless be applied to the polymeric film substrate as aqueous dispersions or alternatively as solutions in organic solvents.

The substrate of a metallised film according to the invention may be formed from any synthetic, film-forming polymeric material. Suitable thermoplastics materials include a homopolymer or copolymer of a 1-olefin, such as ethylene, propylene and but-1-ene, a polyamide, a polycarbonate, and, particularly, a synthetic linear polyester which may be obtained by condensing one or more dicarboxylic acids or their lower alkyl (up to 6 carbon atoms) diesters, e.g. terephthalic acid, isophthalic acid, phthalic acid, 2,5- 2,6- or 2,7- naphthalenedicarboxylic acid, succinic acid, sebacic acid, adipic acid, azelaic acid, 4,4'-diphenyldicarboxylic acid, hexahydro-terephthalic acid or 1,2-bis-p-carboxyphenoxyethane (optionally with a monocarboxylic acid, such as pivalic acid) with one or more glycols, particularly aliphatic glycols e.g. ethylene glycol, 1,3-propanediol, 1,4-butanediol, neopentyl glycol and 1,4-cyclohexanedimethanol. A polyethylene terephthalate film is particularly preferred, especially such a film which has been biaxially oriented by sequential stretching in two mutually perpendicular directions, typically at a temperature in the range 70° to 125° C., and preferably heat set, typically at a temperature in the range 150° to 250° C., for example—as described in British patent 838708.

The substrate may also comprise a polyarylether or thio analogue thereof, particularly a polyaryletherketone, polyarylethersulphone, polyaryletheretherketone, polyaryletherethersulphone, or a copolymer or thioanalogue thereof. Examples of these polymers are disclosed in EP-A-1879, EP-A-184458 and U.S. Pat. No. 4,008,203, particular suitable materials being those sold by ICI Chemicals and Polymers Ltd under the Registered Trade Mark STABAR. Blends of these polymers may also be employed.

Suitable thermoset resin substrate materials include addition—polymerisation resins—such as acrylics, vinyls, bis-maleinides and unsaturated polyesters, formaldehyde condensate resins—such as condensates with urea, melamine or phenols, cyanate resins, isocyanate resins, epoxy resins, functionalised polyesters, polyamides or polyimides.

A polymeric film substrate for production of a metallised film according to the invention may be unoriented, or uniaxially oriented, but is preferably biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. In such a simultaneous stretching process, the adherent coating medium is suitably applied to the substrate either before commencement or after conclusion of the stretching operation. Sequential stretching may be effected in a stenter process by extruding the thermoplastics substrate material as a flat extrudate which is subsequently stretched first in one direction and then in the other mutually perpendicular direction. Generally, it is preferred to stretch firstly in the longitudinal direction, i.e. the forward direction through the film stretching machine, and then in the transverse direction. A stretched substrate film may be, and preferably is, dimensionally stabilised by heat-setting under dimensional restraint at a temperature above the glass transition temperature thereof.

The adherent coating medium may be applied to an already oriented film substrate. However, application of the coating medium is preferably effected before or during the stretching operation.

In particular, it is preferred that the adherent coating medium should be applied to the film substrate between the two stages (longitudinal and transverse) of a biaxial stretching operation. Such a sequence of stretching and coating is especially preferred for the production of a coated linear polyester film substrate, such as a coated polyethylene terephthalate film, which is preferably firstly stretched in the longitudinal direction over a series of rotating rollers, coated with the adherent layer, and then stretched transversely in a stenter oven, preferably followed by heat setting.

The adherent composition may be applied to the polyester film as an aqueous dispersion or solution in an organic solvent by any suitable conventional coating technique such as dip coating, bead coating, reverse roller coating or slot coating.

Modification of the surface of the copolymeric adherent layer, e.g. by flame treatment, ion bombardment, electron beam treatment, ultra-violet light treatment or preferably by corona discharge, may improve the adhesion of the metallised layer applied directly to the copolymeric layer but may not be essential to the provision of satisfactory adhesion.

The preferred treatment by corona discharge may be effected in air at atmospheric pressure with conventional equipment using a high frequency, high voltage generator, preferably having a power output of from 1 to 20 kw at a potential of 1 to 100 kv. Discharge is conveniently accomplished by passing the film over a dielectric support roller at the discharge station at a linear speed preferably of 1.0 to 500 m per minute. The discharge electrodes may be positioned 0.1 to 10.0 mm from the moving film surface.

Satisfactory adhesion of a metallised layer applied directly to the surface of some adherent layers can however be achieved without any prior surface modification, e.g. by corona discharge treatment. An example of an adherent copolymer which provides adequate adhesion without corona discharge treatment is 48/37/10/5 mole % ethyl acrylate/methyl methacrylate/itaconic acid/sodium vinyl sulphonate.

Adherent compositions applied to the polyester film surface are preferably applied as aqueous dispersions. The temperatures applied to the coated film during the subsequent stretching and/or heat setting are effective in drying the aqueous medium, or the solvent in the case of solvent-applied compositions, and also in coalescing and forming the coating into a continuous and uniform subbing layer. The cross-linking of cross-linkable adherent compositions is also achieved at such stretching and/or heat-setting temperatures.

The adherent layer is preferably applied to the polyester film at a coat weight within the range 0.1 to 10 mgdm$^{-2}$, especially 0.5 to 2.0 mgdm$^{-2}$. For films coated on both surfaces with an adherent layer, each layer preferably has a coat weight within the preferred range.

Prior to deposition of the adherent layer onto the polymeric substrate the exposed surface thereof may, if desired, be subjected to a chemical or physical surface-modifying treatment to improve the bond between that surface and the subsequently applied adherent layer. A preferred treatment, because of its simplicity and effectiveness, which is particularly suitable for the treatment of a polyolefin substrate, is to subject the exposed surface of the substrate to a high voltage electrical stress accompanied by corona discharge. Alternatively, the substrate may be pretreated with an agent known in the art to have a solvent or swelling action on the substrate polymer. Examples of such agents, which are particularly suitable for the treatment of a polyester substrate, include a halogenated phenol dissolved in a common organic solvent e.g. a solution of p-chloro-m- cresol, 2,4-dichlorophenol, 2,4,5- or 2,4,6-trichlorophenol or 4-chlororesorcinol in acetone or methanol.

An adherent coating may be applied to one or each surface of the polymeric substrate, and one or each adherent polyester resin layer may be subsequently metallised. Alternatively, one surface of the substrate may be uncoated, or may be coated with a layer of a material other than the herein specified adherent composition. For example, a pressure sensitive adhesive layer may be deposited on the unmetallised surface of a substrate.

Deposition of a metallic layer onto the, or each, adherent layer may be effected by conventional metallising techniques - for example, by deposition from a suspension of finely- divided metallic particles in a suitable liquid vehicle, or by electron beam evaporation, electroless plating, or preferably by a vacuum deposition process in which a metal is evaporated onto the adherent resin surface in a chamber maintained under conditions of high vacuum. Suitable metals include palladium, titanium, chromium, nickel, copper (and alloys thereof, such as bronze), silver, gold, cobalt and zinc, but aluminum is to be preferred for reasons both of economy and ease of bonding to the resin layer.

Metallising may be effected over the entire exposed surface of the adherent resin layer or over only selected portions thereof, as desired.

Metallised films in accordance with the present invention may be prepared in a range of thicknesses governed primarily by the ultimate application for which a particular film is to be employed. Films, having a total thickness in a range extending from 2.5 to 250 $\mu$m are of general utility, although for packaging applications a packaging film of from about 10 to 50 $\mu$m in total thickness is generally suitable.

The ratio of substrate to adherent layer thickness may vary within a wide range, although the thickness of the adherent layer preferably should not be less than 0.004% nor greater than 10% of that of the substrate. In practice, the thickness of the adherent layer is desirably at least 0.01 $\mu$m and preferably should not greatly exceed about 1.0 $\mu$m. The metallic layer is conveniently deposited in a thickness from monoatomic proportions to about 50 $\mu$m or greater, although a preferred range is from 0.005 to 15.0 $\mu$m, and particularly from 0.01 to 0.5 $\mu$m.

One or more of the polymeric layers of a metallised film according to the invention may conveniently contain any of the additives conventionally employed in the manufacture of thermoplastics polymeric films. Thus, agents such as dyes, pigments, voiding agents, lubricants, anti-oxidants, anti-blocking agents, surface active agents, slip aids, gloss-improvers, prodegradants, ultra-violet light stabilisers, viscosity modifiers and dispersion stabilisers may be incorporated in the substrate and/or adherent layer(s), as appropriate. In particular an adherent coating layer, and/or a substrate, may comprise a particulate filler, such as silica, of small particle size. Desirably, a filler, if employed in an adherent layer, should be present in an amount of not exceeding 50% by weight of the adherent copolymer, and the particle size thereof should not exceed 0.5 $\mu$m, preferably less than 0.3 $\mu$m, and especially from 0.005 to 0.2 $\mu$m. A filler, if employed in a substrate layer, should be present in a small amount, not exceeding 0.5%, preferably less than 0.2%, by weight of the substrate. The haze characteristics, of a polymeric film containing a filler of larger particle size are such that a metallised film prepared therefrom exhibits an undesirable-dull appearance.

Application of decorative and/or descriptive matter to the films of the invention may be effected by conventional printing techniques, for example—by printing an inked pattern directly onto the metallic surface of the film and, optionally, protecting the printed matter by a layer of a protective lacquer. Alternatively, reverse printing techniques may be employed whereby the printed matter is embedded in the film at an interlayer position.

Films according to the invention are of utility in a wide range of applications including decorative drapes, reflective screens, mirrors, solar panels, electrical circuit boards, capacitors, magnetic recording media and packaging wraps and pouches. Such films are of particular utility as the internal liner of bag-in-the-box containers for wines, beer and carbonated drinks.

BRIEF DESCRIPTION OF THE DRAWINGS

The invention is illustrated by reference to the accompanying drawings in which:

Referring to FIG. 1 of the drawings, the film comprises a polyester substrate layer (1) having a metallic layer (2) bonded to one surface (3) thereof by an intermediate adherent layer (4) of a copolymer composition according to the invention. Surface (5) of the substrate, remote from metallic layer (2), is uncoated.

Figure 1:
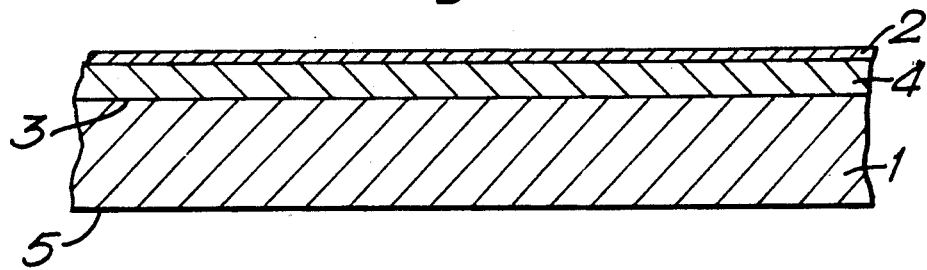
FIG. 1 is a schematic sectional elevation, not to scale, of a polyester film having a single metallic surface layer.
Figure 2:
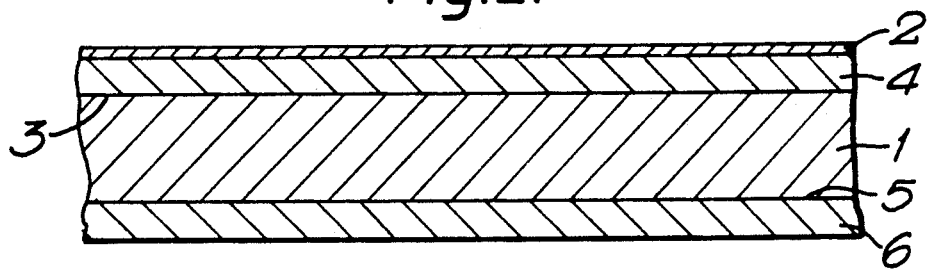
FIG. 2 is a similar schematic elevation of a polyester film having respectively a metallic and an adherent resin surface layer.

The film of FIG. 2 additionally comprises a layer (6) of, for example, an adherent layer bonded to the remote substrate surface (5).

Figure 3:
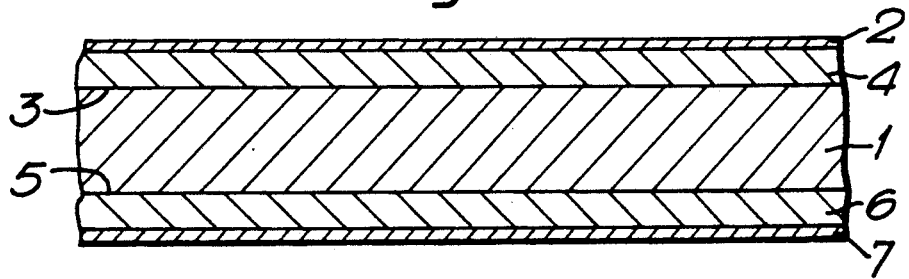
FIG. 3 is a similar schematic elevation of a polyester film metallised on both opposed surfaces.

The film of FIG. 3 further comprises a second metallic layer (7) bonded to a layer (6) of an adherent layer, layer (6) in turn being directly bonded to substrate surface (5).

The invention is further illustrated by reference to the following Examples.

EXAMPLE 1

A copolymer comprising 48/37/10/5 mole % ethyl acrylate/methyl methacrylate/itaconic acid/sodium vinyl sulphonate was synthesised by conventional emulsion copolymerisation. The copolymer was prepared as a 20% w/w aqueous emulsion.

A polyethylene terephthalate film was melt extruded, cast onto a cooled rotating drum and stretched in the direction of extrusion to approximately 3 times its original dimensions. The cooled stretched film was then coated with an aqueous composition containing the following ingredients:

| | |
|---|---|
| Ethyl acrylate/methyl methacrylate/itaconic acid/sodium vinyl sulphonate 48/37/10/5 (20% w/w aqueous emulsion) | 5 liters |
| Melamine-formaldehyde resin (commercially available as 'Cymel' 350) | 0.1 Kg |
| Ammonium p-toluene sulphonate | 0.01 Kg |
| Water-added to give a coating composition of total volume | 25 liters |

The polyethylene terephthalate film was coated on one side to give a wet coating thickness of approximately 5-7 μm.

The coated film was passed into a stenter oven, where the film was dried and stretched in the sideways direction to approximately 3 times its original dimensions. The biaxially stretched coated film was heat set at a temperature of about 200° C. by conventional means. Final film thickness was 12 μm.

The coated side of the film was metallised by a conventional evaporative method to give a layer of aluminum of approximately 500 Å. The metallised film was subjected to a standard peel strength test in order to determine the failure resistance of the laminate. Samples of the metallised film were heat sealed i.e. the metal layer was sealed to a dry adhesive film tape. The seal was achieved using a 'Sentinel' heat-sealer operating at a jaw temperature of 105° C., dwell time of 1 second and jaw pressure of 50 psi ($3.45 \times 10^5$ Nm$^{-2}$). This produced a seal 25 mm wide across the sample.

Peel specimens were prepared by cutting 25 mm wide strips at right angles to the seal, giving a sealed area of 25 mm by 25 mm on each sample, with an unsealed 'tail' at least 100 mm long. Five such specimens were cut from each sealed metallised sample, and the adhesion was measured by peeling apart each specimen using an 'Instron' Tensometer at a peel speed of 200 mm min$^{-1}$. The peel load was recorded for each specimen and the amount of aluminum transferred to the dry adhesive tape was visually assessed in each case. Results are given in Table 1.

EXAMPLE 2

Example 1 was repeated, except that this time when the coated polyethylene terephthalate film emerged from the stenter it was subjected to corona discharge treatment by passing the film through a commercially available 'Vetaphone' 3 Kw treater, with an electrode to film distance of 1 mm.

The corona-treated film was metallised as described in Example 1, and the test results are given in Table 1.

EXAMPLE 3

This is a comparative example not according to the invention. Example 1 was repeated except that the polymeric coating stage was omitted. The uncoated polyethylene terephthalate film was metallised as described in Example 1, and the results of the peel strength test are given in Table 1.

TABLE 1

| Example | Peel Strength g/25 mm (Nm$^{-1}$) | Aluminium removed % |
|---|---|---|
| 1 | 900* (353.1) | 0 |
| 2 | 900* (353.1) | 0 |
| 3 (comparative) | 200 (78.5) | 90 |

*laminate failed due to film breakage. There was no delamination between the metal layer and polymeric coating.

The superior peel strength of, and resistance to removal of aluminum from, metallised films of the present invention is evident from the above results.

I claim:

1. A metallised film comprising a substrate layer of a synthetic polymeric material having on at least one surface thereof an adherent layer and a metallic layer on the surface of the at least one adherent layer remote from the substrate, characterised in that the adherent layer comprises an acrylic or methacrylic copolymer, the copolymer comprising
    (a) a comonomer selected from acrylic acid, methacrylic acid or a derivative of acrylic acid or methacrylic acid,
    (b) a copolymerisable sulphonated ethylenically unsaturated comonomer, and optionally
    (c) an additional comonomer, said comonomers (a) and (b) being present in the respective molar percentages in the ranges (a) 26 to 99% and (b) 1 to 50%.

2. A metallised film as claimed in claim 1, wherein comonomer (a) comprises, based on the copolymer, a mixture of an alkyl acrylate and an alkyl methacrylate in a total molar proportion in the range 55 to 80 mole %.

3. A metallised film as claimed in claim 2, wherein comonomer (a) comprises, based on the copolymer, a mixture of 15 to 45 mole % of the alkyl acrylate and 30 to 50 mole % of the alkyl methacrylate.

4. A metallised film as claimed in claim 1, wherein comonomer (b) is selected from vinyl sulphonic acid, allyl sulphonic acid, methallyl sulphonic acid, p-styrene sulphonic acid and the salts of these acids.

5. A metallised film as claimed in claim 1 of the preceding claims, wherein the additional comonomer (c) is selected from one or more of itaconic acid, itaconic anhydride, half esters of itaconic acid, glycidyl acrylate and glycidyl methacrylate.

6. A metallised film as claimed in claim 5, wherein the copolymer comprises 15 to 45 mole % alkyl acrylate/30 to 50 mole % alkyl methacrylate/10 to 20 mole % sulphonated comonomer/7 to 20 mole % itaconic acid.

7. A metallised film as claimed in claim 1 of the preceding claims, wherein the adherent copolymer layer has been at least partially cross-linked.

8. A metallised film as claimed in claim 1 of preceding claims, wherein the adherent copolymer layer contains a particulate filler having a particle size less than 0.5 μm, and being present in an amount of up to 50% by weight of the adherent resin.

* * * * *